United States Patent
Tian et al.

(10) Patent No.: US 12,453,120 B2
(45) Date of Patent: Oct. 21, 2025

(54) HV DEVICE AND METHOD FOR MANUFACTURING SAME

(71) Applicant: Shanghai Huali Integrated Circuit Corporation, Shanghai (CN)

(72) Inventors: Zhi Tian, Shanghai (CN); Hua Shao, Shanghai (CN); Haoyu Chen, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 390 days.

(21) Appl. No.: 18/344,489

(22) Filed: Jun. 29, 2023

(65) Prior Publication Data

US 2024/0170572 A1    May 23, 2024

(30) Foreign Application Priority Data

Nov. 18, 2022   (CN) .......................... 202211443449.6

(51) Int. Cl.
| | | |
|---|---|---|
| *H01L 29/78* | (2006.01) | |
| *H10D 30/01* | (2025.01) | |
| *H10D 30/65* | (2025.01) | |
| *H10D 62/10* | (2025.01) | |
| *H10D 62/13* | (2025.01) | |

(52) U.S. Cl.
CPC ......... *H10D 30/65* (2025.01); *H10D 30/0281* (2025.01); *H10D 62/116* (2025.01); *H10D 62/157* (2025.01)

(58) Field of Classification Search
None
See application file for complete search history.

(56) References Cited

U.S. PATENT DOCUMENTS

2009/0166744 A1* 7/2009 Kim ..................... H10D 62/116
257/E21.409

* cited by examiner

*Primary Examiner* — William C Trapanese
(74) *Attorney, Agent, or Firm* — Banner & Witcoff, Ltd.

(57) ABSTRACT

The present application discloses an HV device, comprising: a gate dielectric layer formed in a first trench, a gate conductive material layer formed on the surface of the gate dielectric layer, and a second dielectric layer filling a second trench formed between a second side face of a drain shallow trench isolation and a first side face of the first trench. The depths of the first trench and the second trench are equal. The first trench and the second trench connect with each other to form an overall trench. Bottom surfaces of the second dielectric layer and the gate dielectric layer are flush with each other. A first side face of the gate conductive material layer extends to the surface of the second dielectric layer. The present application also discloses a method for manufacturing the HV device.

16 Claims, 4 Drawing Sheets

HV DEVICE AND METHOD FOR MANUFACTURING SAME

CROSS-REFERENCES TO RELATED APPLICATIONS

This application claims the priority to Chinese patent application No. CN 202211443449.6, filed on Nov. 18, 2022, and entitled "HV DEVICE AND METHOD FOR MANUFACTURING SAME", the disclosure of which is incorporated herein by reference in entirety.

TECHNICAL FIELD

The present application relates to the field of manufacturing semiconductor integrated circuits, in particular, to an integrated circuit high voltage (HV) device. The present application also relates to a method for manufacturing an integrated circuit HV device.

BACKGROUND

As the third-generation display technology, an organic light emitting diode (OLED) is a current-injection composite light emitting type of device with main advantages such as high brightness, high contrast, wide viewing angle, fast response speed, low operating voltage, strong adaptability, high energy conversion efficiency, and a simple manufacturing process. The OLED attracts widespread attention from both academia and industry due to its significant technological advantages and application prospects.

The OLED is a current-driven type of device, and the current density of the OLED depends on the driving voltage between two ends of the diode, where a higher voltage results in a larger current density. OLED devices age during any long-term use, so the relationship between voltage, current density, and light emitting brightness may not always remain constant. The most direct manifestation of the OLED device's aging is an increase in the OLED switch-on voltage and a decrease in light emitting efficiency. To maintain the same light emitting brightness, it is necessary to increase a current flowing through the OLED, so a high voltage device is required in the OLED to achieve the function of a high current.

On the other hand, internal storage modules of the OLED are capacity limited, so it is necessary to select an external memory to store image data. The static random access memory (SRAM) has become a commonly used memory in an OLED due to its high read-write speed and capability of maintaining data without any refresh operation in a power-on case.

With the advancement of the logic device technology nodes, OLED technology combined with advanced logic device technology has been developed continuously. Currently, the most advanced technology node in mass HV IC production is a technology combined with 28-nanometer high voltage metal gate (28HV MG), which takes the advantage of the high performance and low voltage of the advanced nodes. In the 28HV MG technology, it is necessary to integrate a low voltage SRAM and a high voltage driving device. However, a high voltage device requires the use of thick silicon oxide as a gate dielectric layer, however the thick gate dielectric layer affects subsequent standard processes of the metal gate. A low voltage (LV) device adopts a thinner gate dielectric layer, such as a gate oxide layer, with a source and drain region formed in a semiconductor substrate on two sides of a gate structure using a self-aligned technique. A withstand voltage of a medium voltage (MV) device is higher than that of the LV device, and the thickness of the gate dielectric layer of the MV device is greater than the thickness of the gate dielectric layer of the LV device. A HV device requires a thicker gate dielectric layer, and also requires the provision of a shallow trench isolation (STI) in a drain structure, that is, the drain structure of the HV device further includes a drain shallow trench isolation, so as to achieve a higher withstand voltage.

In order to be compatible with the standard metal gate technology process, etching back is performed to form an active region recess in a high voltage (HV) region, followed by growing a thick silicon oxide to keep the surface height close to that of the active region as much as possible, thereby enabling subsequent process development. FIGS. 1A-1C are schematic diagrams of device structures in steps of forming a gate dielectric layer in an existing method for manufacturing an HV device. The steps of forming the gate dielectric layer in the existing method for manufacturing an HV device include the following:

Referring to FIG. 1A, a semiconductor substrate 101 is provided, wherein a shallow trench isolation 102 is formed on the semiconductor substrate 101, and the region in the semiconductor substrate 101 enclosed by the shallow trench isolations 102 is an active region.

A hard mask layer 103 is formed on the surface of the semiconductor substrate 101, wherein the material of the hard mask layer 103 includes silicon nitride.

A lithography patterning process is performed to form a photoresist pattern 104, wherein the photoresist pattern 104 is defined by using a mask of a gate conductive material layer, and therefore, a region opened by the photoresist pattern 104 is a formation region of the gate conductive material layer.

Referring to FIG. 1B, a trench 105 is opened by the photoresist pattern 104 and etching in the semiconductor substrate 101, wherein the trench 105 is formed in an overlap region of the active region between the photoresist pattern 104 and the shallow trench isolation 102.

Referring to FIG. 1C, the trench 105 is filled with a dielectric layer, such as silicon oxide, so as to form a gate dielectric layer.

A field diffusion drain (FDD) structure is used in the high voltage (HV) device of the standard 28-nanometer process. The source and the drain in a symmetrical structure each includes a shallow trench isolation (STI) structure, while in an asymmetrical structure only a drain field diffusion region includes an STI. When the device is turned on, a conduction current flows near the STI and is transmitted. When high voltages are applied to the gate and the drain simultaneously, during an initial operation stage, positive charge carrier holes in a channel are prone to be trapped at top corners of the STI under the gate, causing an increase in the current and a decrease in on-resistance. As the operation time elapses, negative charge carrier electrons are trapped at top corners of the STI near the drain, causing a decrease in the corresponding current and an increase in on-resistance, and thereby making the operation of the device unstable. Such effect is mainly caused by impact ionization and vertical electric field distribution resulting from a case where the current is closer to a Si/SiO2 interface when the gate and drain are under a high voltage, including the following cases, when the gate and the drain are under high voltages simultaneously:

(a) simulation of impact ionization shows that at the top corner of the STI below the gate and at the top corner of the STI near the drain the impact ionization is strong; and (b) simulation of a vertical electric field along the STI shows that the strongest electric field below the gate is at the top corner of the STI and the strongest electric field has a negative intensity, as a negative electric field intensity leads to enables hole injection, holes in the channel are prone to be trapped at the top corner of the STI below the gate; and the strongest electric field near the drain is on the edge of the STI and the strongest electric field has a positive intensity, so electrons are prone to be trapped on the edge of the STI near the drain.

FIG. 2A is a layout of an existing HV device. FIG. 2B is a cross sectional view of the existing HV device along a line A1A2 in FIG. 2A. FIG. 2C is a cross sectional view of the existing HV device along a line B1B2 in FIG. 2A. In FIG. 2C, the existing HV device is illustrated using an asymmetrical structure and an N-type device as examples. The existing HV device includes:

a gate dielectric layer 208, wherein the gate dielectric layer 208 is formed in a trench 211, the trench 211 is formed by etching a semiconductor substrate 201, and a top surface of the gate dielectric layer 208 is flush with a top surface of the semiconductor substrate 201.

A gate conductive material layer 209 is formed on the surface of the gate dielectric layer 208. Sidewall spacers 210 is formed on both side faces of the gate conductive material layer 209.

The material of the gate dielectric layer 208 includes silicon oxide.

The gate conductive material layer 209 includes a metal gate.

A first high voltage well region 203 doped with a second conductivity type of impurity is formed on the semiconductor substrate 201.

A drain structure is formed in the first high voltage well region 203 outside a first side face of the gate dielectric layer 208, and a source structure is formed in the first high voltage well region 203 outside a second side face of the gate dielectric layer 208.

The drain structure includes a drain high voltage diffusion region 204a doped with a first conductivity type of impurity, a drain shallow trench isolation 202a, and a drain region 206a heavily doped with the first conductivity type of impurity.

The drain high voltage diffusion region 204a is formed in the first high voltage well region 203. The drain shallow trench isolation 202a is located in the drain high voltage diffusion region 204a. A second side face of the drain shallow trench isolation 202a is aligned with a first side face of the trench 211. The depth of the drain shallow trench isolation 202a is greater than the depth of the trench 211. A first side face of the gate conductive material layer 209 extends to the surface of the drain shallow trench isolation 202a.

The drain region 206a is formed in a surface region of the drain high voltage diffusion region 204a outside a first side face of the drain shallow trench isolation 202a.

The source structure includes a source high voltage diffusion region 204b and a source region 206b heavily doped with the first conductivity type. of impurity The source high voltage diffusion region 204b is formed in the first high voltage well region 203. The source region 206b is formed in a surface region of the source high voltage diffusion region 204b.

The first side face of the gate dielectric layer 208 extends into the drain high voltage diffusion region 204a. The second side face of the gate dielectric layer 208 extends into the source high voltage diffusion region 204b. A channel region is composed of the first high voltage well region 203 at the bottom of the gate dielectric layer 208.

In the existing method, an etching region of the trench 211 is defined by using a mask of the gate conductive material layer 209. Referring to FIG. 2A, a plurality of shallow trench isolations 202 is formed in the semiconductor substrate 201, a plurality of active regions are defined by means of the shallow trench isolations 202, a formation region of the shallow trench isolation 202 is a white region, all the active regions are marked with 201a, 201b, and 201c, respectively, and the drain shallow trench isolation 202a is located between the active regions 201b and 201c. Doped region structures formed in the active regions 201a, 201b, and 201c are not shown in FIG. 2A. The drain region 206a is formed in the active region 201b, and the drain high voltage diffusion region 204a is mainly formed in the active region 201b and extends into the active region 201c. The gate conductive material layer 209 is referred to as a dashed line, and it can be seen that the gate conductive material layer 209 mainly covers a selected region of the active region 201c and extends to the surface of the shallow trench isolation 202 outside the active region 201c. The etching region of the trench 211 is defined by using the mask of the gate conductive material layer 209. During etching of the trench 211, a surface region of the semiconductor substrate 201 in the active region 201c that is in a region covered by the gate conductive material layer 209 is etched, and the trench 211 is not formed in the shallow trench isolation 202 outside the active region 201c, that is, the etching region of the trench 211 is an overlap region between the gate conductive material layer 209 and the active region 201c.

The HV device shown in FIG. 2C is of an asymmetrical structure, with the source region 206b being self-aligned with the second side face of the gate dielectric layer 208. In FIG. 2A, the source region 206b is formed in the active region 201c outside the region covered by the gate conductive material layer 209.

A peripheral high voltage diffusion region 205 doped with the second conductivity type of impurity is also formed in the first high voltage well region 203 on the periphery of the HV device. A substrate pickup region 207 heavily doped with the second conductivity type of impurity is formed on the surface of the peripheral high voltage diffusion region 205. The substrate pickup region 207 is electrically connected to the source region 206b. In FIG. 2A, the peripheral high voltage diffusion region 205 is formed in the active region 201a, and it can be seen that the active region 201a presents an annular structure, that is, the two peripheral high voltage diffusion regions 205 shown in FIG. 2C are actually one and the same structure.

The HV device may also be of a symmetrical structure, with a source shallow trench isolation being formed in the source high voltage diffusion region 204b. The source shallow trench isolation is not shown in FIG. 2. A first side face of the source shallow trench isolation is aligned with the second side face of the gate dielectric layer 208, and the source region 206b is self-aligned with a second side face of the source shallow trench isolation. The source shallow trench isolation and the drain shallow trench isolation 202a present a symmetrical structure.

The HV device is an N type device, the first conductivity type is an N type, and the second conductivity type is a P type.

The semiconductor substrate 201 is P type doped. In FIG. 2C, the semiconductor substrate 201 is also referred to as P-sub, and the first high voltage well region 203 is referred to as HVPW, HVPW is the abbreviation of high voltage P type well. Both of the drain high voltage diffusion region 204a and the source high voltage diffusion region 204b are also referred to as HVNDF, the HVNDF is the abbreviation of high voltage N type diffusion. The peripheral high voltage diffusion region 205 is referred to as HVPDF, HVPDF is the abbreviation of high voltage P type diffusion. The drain region 206a and the source region 206b are referred to as SDN, SDN representing N type source and drain region. The substrate pickup region 207 is referred to as SDP, SDP representing P type source and drain region. The shallow trench isolation 202 is also referred to as STI.

A metal interconnection layer is also formed on the semiconductor substrate, and the metal interconnection layer is not shown in FIG. 2C. The metal interconnection layer forms a plurality of front metal layer patterns and vias connecting the front metal layer patterns, ultimately forming a source, a drain, and a gate by patterning front metal layers.

The drain region 206a is connected to the drain, and the source region 206b and the substrate pickup region 207 are both connected to the source, that is, the source serves as a substrate bulk. The gate conductive material layer 209 is connected to the gate.

As can be seen from FIG. 2C, the gate conductive material layer 209 extends to the surface of the drain shallow trench isolation 202a. Similarly, as can be seen from FIG. 2B, the gate conductive material layer 209 extends to the surface of the drain shallow trench isolation 202a. A bottom corner of the second side face of the drain shallow trench isolation 202a is covered by the gate conductive material layer 209, and the bottom corner of the second side face of the drain shallow trench isolation 202a is a sharp corner. When high voltages are applied to the gate and the drain simultaneously, a vertical negative electric field is present at the sharp corner of the drain shallow trench isolation 202a below the gate, resulting in hole trapping at the STI sharp corner, and thereby causing a surge current in the device under initial high voltage operation.

BRIEF SUMMARY

According to some embodiments in this application, a HV device includes:

a gate dielectric layer, wherein the gate dielectric layer is formed in a first trench, the first trench is formed by etching a semiconductor substrate, and a top surface of the gate dielectric layer is flush with a top surface of the semiconductor substrate.

A gate conductive material layer is formed on the surface of the gate dielectric layer.

A first high voltage well region doped with a second conductivity type of impurity is formed on the semiconductor substrate.

A drain structure is formed in the first high voltage well region outside a first side face of the gate dielectric layer, and a source structure is formed in the first high voltage well region outside a second side face of the gate dielectric layer.

The drain structure includes a drain high voltage diffusion region doped with a first conductivity type of impurity, a drain shallow trench isolation, a second dielectric layer, and a drain region heavily doped with the first conductivity type of impurity.

The drain high voltage diffusion region is formed in the first high voltage well region, and the drain shallow trench isolation is formed in a selected region of the drain high voltage diffusion region.

A second trench is formed in the drain high voltage diffusion region between a second side face of the drain shallow trench isolation and a first side face of the first trench, and the second dielectric layer is formed in the second trench.

The second side face of the drain shallow trench isolation is aligned with a first side face of the second trench. A second side face of the second trench is aligned with the first side face of the first trench. The depth of the drain shallow trench isolation is greater than the depth of the first trench.

The depth of the first trench is equal to the depth of the second trench, and the first trench and the second trench connect with each other to form an overall trench. Bottom surfaces of the second dielectric layer and the gate dielectric layer are flush with each other. A first side face of the gate conductive material layer extends to the surface of the second dielectric layer, such that a region covered by the gate conductive material layer has no sharp corner and is away from a bottom sharp corner of the drain shallow trench isolation.

The drain region is formed in a surface region of the drain high voltage diffusion region outside a first side face of the drain shallow trench isolation, and a junction depth of the drain region is less than the thickness of the second dielectric layer.

The source structure includes a source high voltage diffusion region and a source region heavily doped with the first conductivity type of impurity, the source high voltage diffusion region is formed in the first high voltage well region, and the source region is formed in a surface region of the source high voltage diffusion region.

The first side face of the gate dielectric layer extends into the drain high voltage diffusion region, and the second side face of the gate dielectric layer extends into the source high voltage diffusion region. A channel region is composed of the first high voltage well region at the bottom of the gate dielectric layer.

In some cases, the first trench and the second trench are formed simultaneously by means of the same etching process.

In some cases, an active region is defined in the semiconductor substrate by means of a shallow trench isolation, and the active region is composed of the semiconductor substrate in a region enclosed by the shallow trench isolation.

The drain shallow trench isolation is the shallow trench isolation in a formation region of the drain structure, an active region where the channel region is located is a first active region, and a first side face of the first active region is defined by the second side face of the drain shallow trench isolation.

An etching region of the first trench is defined by using a mask of the gate conductive material layer.

The first side face of the first active region extends towards one side of the drain region to the outside of the first side face of the gate conductive material layer, and an etching region of the second trench is formed by extending the etching region of the first trench to the surface of the drain shallow trench isolation.

In some cases, the second dielectric layer and the gate dielectric layer are formed simultaneously by means of the same process.

In some cases, the material of the gate dielectric layer includes silicon oxide or a high dielectric constant material.

In some cases, the gate conductive material layer includes a metal gate.

In some cases, the HV device is of an asymmetrical structure, and the source region is self-aligned with the second side face of the gate dielectric layer.

Alternatively, the HV device is of a symmetrical structure, a source shallow trench isolation is formed in the source high voltage diffusion region, a first side face of the source shallow trench isolation is aligned with the second side face of the gate dielectric layer, and the source region is self-aligned with a second side face of the source shallow trench isolation; and the source shallow trench isolation and the drain shallow trench isolation present a symmetrical structure.

In some cases, a peripheral high voltage diffusion region doped with the second conductivity type of impurity is also formed in the first high voltage well region on the periphery of the HV device, a substrate pickup region heavily doped with the second conductivity type of impurity is formed on the surface of the peripheral high voltage diffusion region, and the substrate pickup region is electrically connected to the source region.

In order to solve the above technical problem, the method for manufacturing an HV device provided by the present application includes the following steps:

step 1, providing a semiconductor substrate, wherein a first high voltage well region doped with a second conductivity type of impurity is formed on the semiconductor substrate, a drain high voltage diffusion region doped with a first conductivity type of impurity and a source high voltage diffusion region are formed in selected regions of the first high voltage well region, and a drain shallow trench isolation is formed in a selected region of the drain high voltage diffusion region;

step 2, defining an etching region of a first trench, and etching the semiconductor substrate in the etching region of the first trench to form the first trench; and defining an etching region of a second trench, and etching the semiconductor substrate in the etching region of the second trench to form the second trench, wherein the second trench is formed in the drain high voltage diffusion region between a second side face of the drain shallow trench isolation and a first side face of the first trench;

the second side face of the drain shallow trench isolation is aligned with a first side face of the second trench; a second side face of the second trench is aligned with the first side face of the first trench; the depth of the drain shallow trench isolation is greater than the depth of the first trench; and the depth of the first trench is equal to the depth of the second trench, and the first trench and the second trench connect with each other to form an overall trench;

step 3, filling the first trench with a gate dielectric layer, and filling the second trench with a second dielectric layer, wherein a top surface of the gate dielectric layer and a top surface of the second dielectric layer are both flush with a top surface of the semiconductor substrate;

bottom surfaces of the second dielectric layer and the gate dielectric layer are flush with each other;

a first side face of the gate dielectric layer extends into the drain high voltage diffusion region, and a second side face of the gate dielectric layer extends into the source high voltage diffusion region; and a channel region is composed of the first high voltage well region at the bottom of the gate dielectric layer;

step 4, forming a gate conductive material layer, wherein the gate conductive material layer is located on the surface of the gate dielectric layer and extends to the surface of the second dielectric layer, and a region covered by the gate conductive material layer has no sharp corner and is away from a bottom sharp corner of the drain shallow trench isolation; and step 5, performing source and drain injection heavily doped with the first conductivity type of impurity to form a source region and a drain region, wherein the drain region is formed in a surface region of the drain high voltage diffusion region outside a first side face of the drain shallow trench isolation in a self-aligned manner, and a junction depth of the drain region is less than the thickness of the second dielectric layer;

the source region is formed in a surface region of the source high voltage diffusion region;

a drain structure is located in the first high voltage well region outside the first side face of the gate dielectric layer, and a source structure is located in the first high voltage well region outside the second side face of the gate dielectric layer;

the drain structure includes the drain high voltage diffusion region, the drain shallow trench isolation, the second dielectric layer, and the drain region; and the source structure includes the source high voltage diffusion region and the source region.

In some cases, the first trench and the second trench are formed simultaneously by means of the same etching process in step 2.

In some cases, an active region is defined in the semiconductor substrate by means of a shallow trench isolation in step 1, and the active region is composed of the semiconductor substrate in a region enclosed by the shallow trench isolation; the drain shallow trench isolation is the shallow trench isolation in a formation region of the drain structure, an active region where the channel region is located is a first active region, and a first side face of the first active region is defined by the second side face of the drain shallow trench isolation.

The first side face of the first active region extends towards one side of the drain region to the outside of a first side face of the gate conductive material layer.

The etching region of the first trench is defined by using a mask of the gate conductive material layer in step 2.

The etching region of the second trench is formed by extending the etching region of the first trench to the surface of the drain shallow trench isolation.

In some cases, the second dielectric layer and the gate dielectric layer are formed simultaneously by means of the same process in step 3.

In some cases, the material of the gate dielectric layer in step 3 includes silicon oxide or a high dielectric constant material.

In some cases, the gate conductive material layer in step 4 includes a metal gate.

In some cases, the HV device is of an asymmetrical structure, and the source region is self-aligned with the second side face of the gate dielectric layer in step 5.

Alternatively, the HV device is of a symmetrical structure, a source shallow trench isolation is formed in the source high voltage diffusion region in step 1, a first side face of the source shallow trench isolation is aligned with the second side face of the gate dielectric layer in step 3, and the source region is self-aligned with a second side face of the source shallow trench isolation in step 5; and the source shallow trench isolation and the drain shallow trench isolation present a symmetrical structure.

In some cases, a peripheral high voltage diffusion region doped with the second conductivity type of impurity is also formed in the first high voltage well region on the periphery of the HV device in step 1.

After step 5, the method further includes performing source and drain injection heavily doped with the second conductivity type of impurity to form a substrate pickup region on the surface of the peripheral high voltage diffusion region, and the substrate pickup region is electrically connected to the source region.

In the present application, the second dielectric layer is disposed between the drain shallow trench isolation and the gate dielectric layer, the bottom surface of the second dielectric layer is flush with the bottom surface of the gate dielectric layer, and the first side face of the gate conductive material layer extends to the surface of the second dielectric layer, such that the gate conductive material layer does not extend to the surface of the drain shallow trench isolation. Since the bottom surface of the second dielectric layer is flush with the bottom surface of the gate dielectric layer, the region covered by the gate conductive material layer is a flat region, eliminating the sharp corner of the shallow trench isolation below the gate conductive material layer and thereby eliminating the problem of a surge current in the device under initial high voltage operation which is caused by angled coverage of gate conductive material layer on the shallow trench isolation.

Moreover, in the present application, the second trench where the second dielectric layer is located and the first trench connect with each other to form an overall trench structure. In the prior art, the first trench is directly defined by using the mask of the gate conductive material layer. In the present application, by extending the active region corresponding to the second side face of the drain shallow trench isolation and extending the mask of the gate conductive material layer, both the first trench and the second trench can be obtained simultaneously via lithography definition and an etching process. Therefore, the present application can be achieved by improving a layout, and a process thereof is simple and easy to be implemented.

BRIEF DESCRIPTION OF THE DRAWINGS

The present application will be further described in detail below with reference to the drawings and specific implementations.

DETAILED DESCRIPTION OF THE DISCLOSURE

Figure 1A:
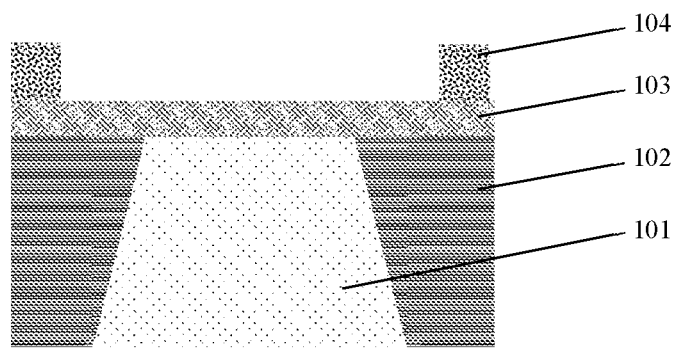
FIGS. 1A-1C are schematic diagrams of device structures in steps of forming a gate dielectric layer in an existing method for manufacturing an HV device.
Figure 1B:
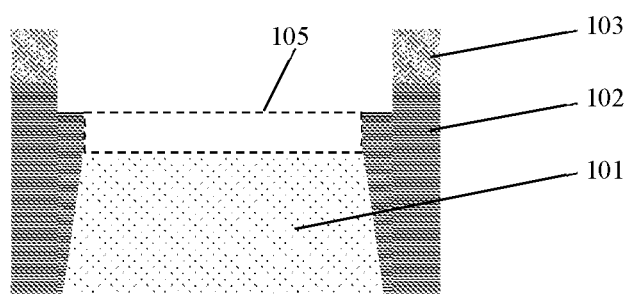
Figure 1C:
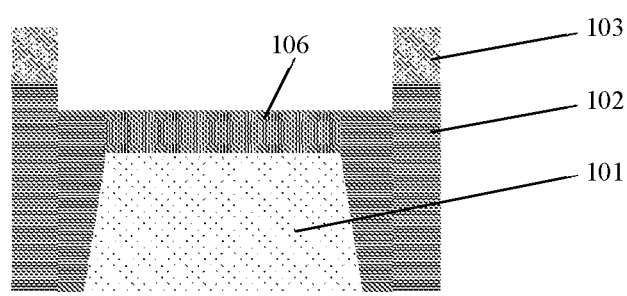
Figure 2A:
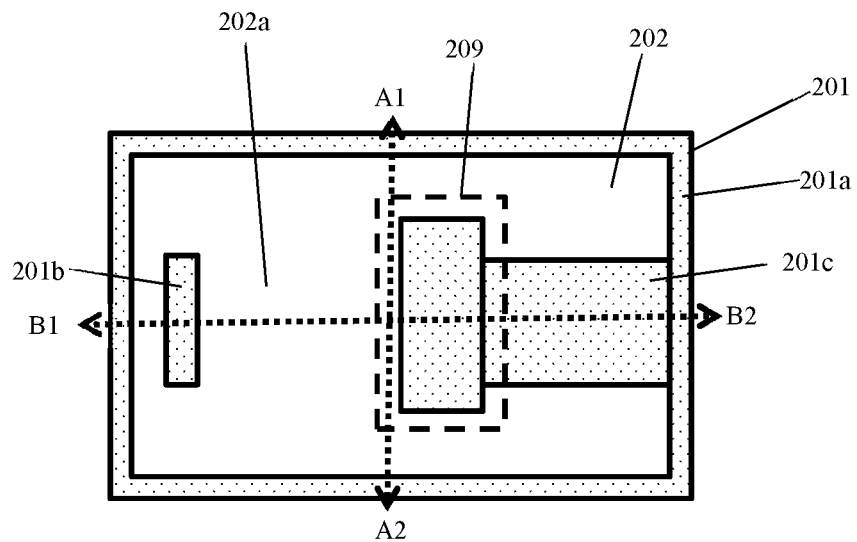
FIG. 2A is a layout of an existing HV device.
Figure 2B:
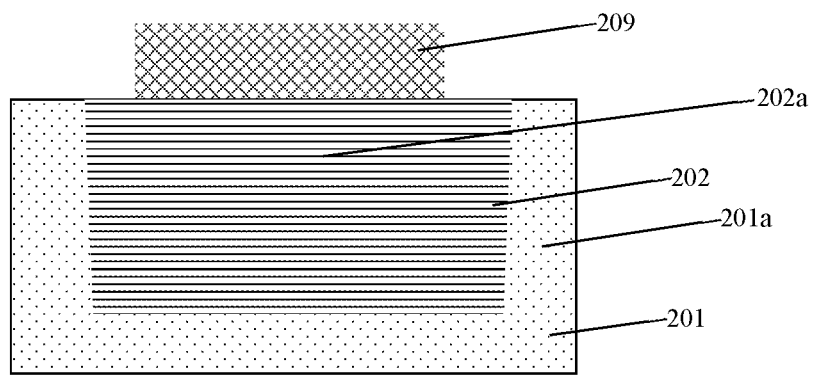
FIG. 2B is a sectional view of the existing HV device along a line A1A2 in FIG. 2A.
Figure 2C:
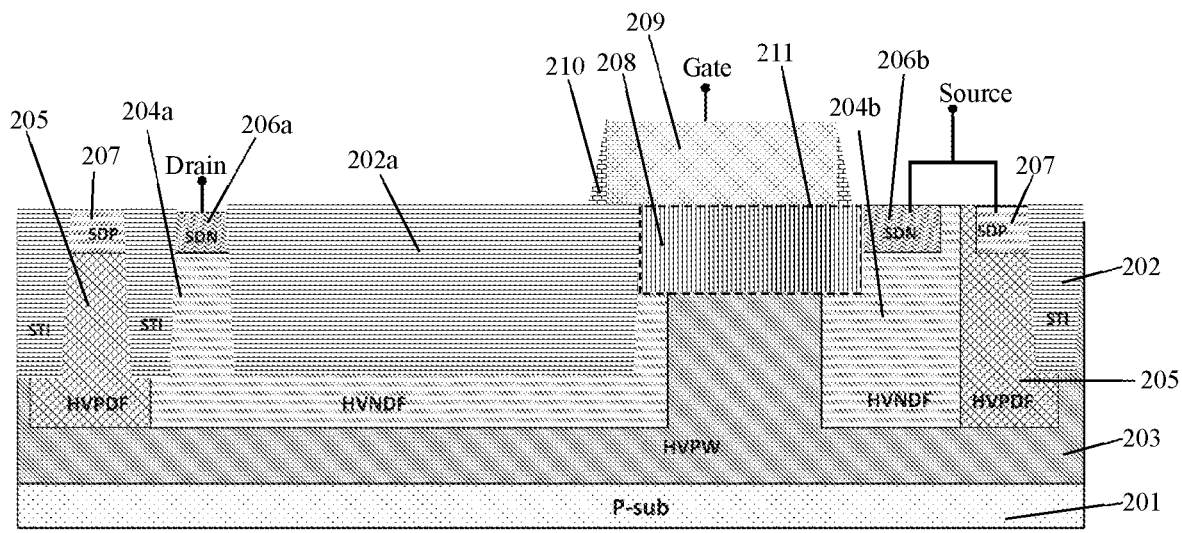
FIG. 2C is a sectional view of the existing HV device along a line B1B2 in FIG. 2A.
Figure 3A:
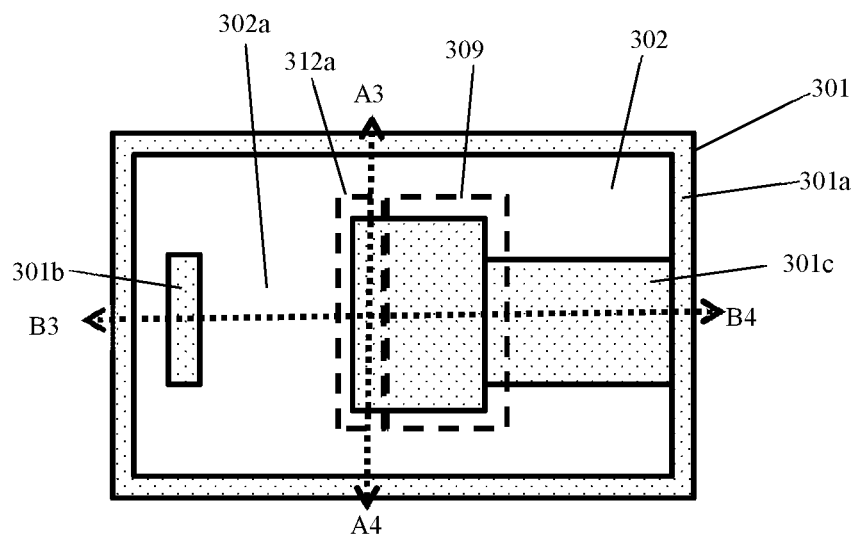
FIG. 3A is a layout of an HV device according to an embodiment of the present application.
Figure 3B:
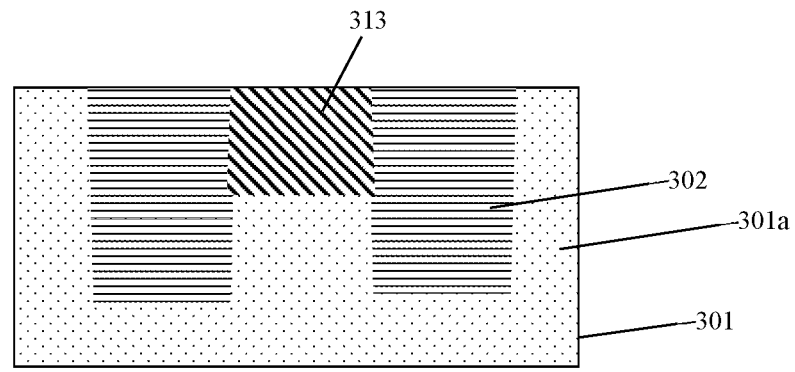
FIG. 3B is a sectional view of the HV device along a line A3A4 in FIG. 3A according to an embodiment of the present application.
Figure 3C:
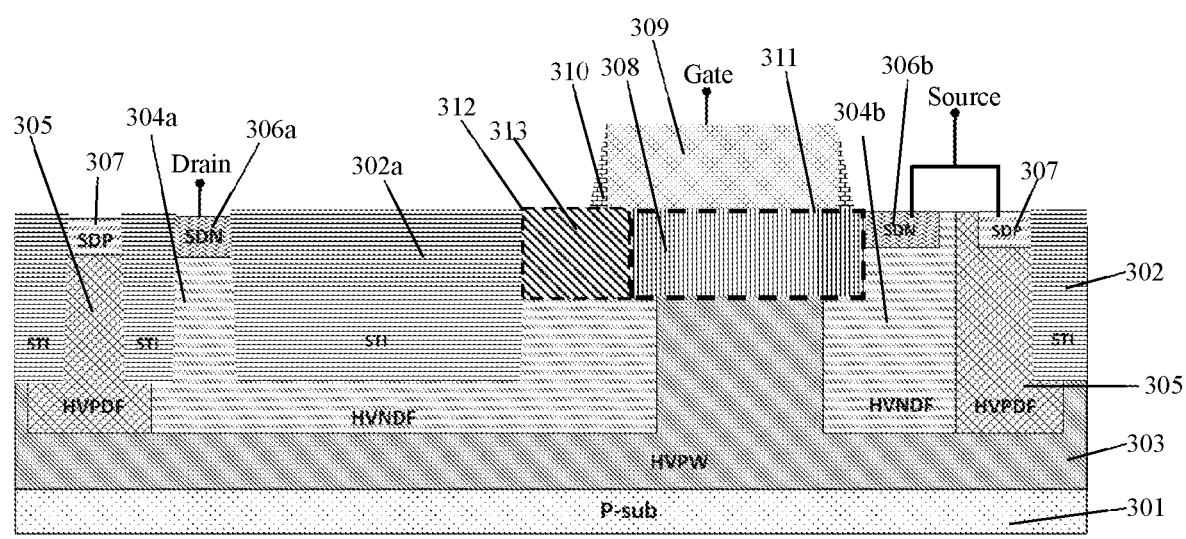
FIG. 3C is a sectional view of the HV device along a line B3B4 in FIG. 3A according to an embodiment of the present application.

FIG. 3A is a layout of an HV device according to an embodiment of the present application. FIG. 3B is a sectional view of the HV device along a line A3A4 in FIG. 3A according to this embodiment of the present application. FIG. 3C is a sectional view of the HV device along a line B3B4 in FIG. 3A according to this embodiment of the present application. In FIG. 3C, the HV device according to this embodiment of the present application is illustrated using an asymmetrical structure and an N-type device as examples. The HV device according to this embodiment of the present application includes:

a gate dielectric layer 308, wherein the gate dielectric layer 308 is formed in a first trench 311, the first trench 311 is formed by etching a semiconductor substrate 301, and a top surface of the gate dielectric layer 308 is flush with a top surface of the semiconductor substrate 301.

A gate conductive material layer 309 is formed on the surface of the gate dielectric layer 308.

The gate conductive material layer 309 includes a metal gate.

A sidewall spacer 310 is formed on a side face of the gate conductive material layer 309.

A first high voltage well region 303 doped with a second conductivity type of impurity is formed on the semiconductor substrate 301.

A drain structure is formed in the first high voltage well region 303 outside a first side face of the gate dielectric layer 308, and a source structure is formed in the first high voltage well region 303 outside a second side face of the gate dielectric layer 308.

The drain structure includes a drain high voltage diffusion region 304a doped with a first conductivity type of impurity, a drain shallow trench isolation 302a, a second dielectric layer 313, and a drain region 306a heavily doped with the first conductivity type of impurity.

The drain high voltage diffusion region 304a is formed in the first high voltage well region 303, and the drain shallow trench isolation 302a is formed in a selected region of the drain high voltage diffusion region 304a.

A second trench 312 is formed in the drain high voltage diffusion region 304a between a second side face of the drain shallow trench isolation 302a and a first side face of the first trench 311, and the second dielectric layer 313 is formed in the second trench 312.

The second side face of the drain shallow trench isolation 302a is aligned with a first side face of the second trench 312. A second side face of the second trench 312 is aligned with the first side face of the first trench 311. The depth of the drain shallow trench isolation 302a is greater than the depth of the first trench 311.

The depth of the first trench 311 is equal to the depth of the second trench 312, and the first trench 311 and the second trench 312 connect with each other to form an overall trench. Bottom surfaces of the second dielectric layer 313 and the gate dielectric layer 308 are flush with each other. A first side face of the gate conductive material layer 309 extends to the surface of the second dielectric layer 313, such that a region covered by the gate conductive material layer 309 has no sharp corner and is away from a bottom sharp corner of the drain shallow trench isolation 302a.

The drain region 306a is formed in a surface region of the drain high voltage diffusion region 304a outside a first side face of the drain shallow trench isolation 302a, and a junction depth of the drain region 306a is less than the thickness of the second dielectric layer 313.

The source structure includes a source high voltage diffusion region 304b and a source region 306b heavily doped with the first conductivity type of impurity, the source high voltage diffusion region 304b is formed in the first high voltage well region 303, and the source region 306b is formed in a surface region of the source high voltage diffusion region 304b.

The first side face of the gate dielectric layer 308 extends into the drain high voltage diffusion region 304a, and the second side face of the gate dielectric layer 308 extends into the source high voltage diffusion region 304b. A channel region is composed of the first high voltage well region 303 at the bottom of the gate dielectric layer 308.

In this embodiment of the present application, the first trench 311 and the second trench 312 are formed simultaneously by means of the same etching process.

An active region is defined in the semiconductor substrate 301 by means of a shallow trench isolation 302, and the active region is composed of the semiconductor substrate 301 in a region enclosed by the shallow trench isolation 302. Referring to FIG. 3A, a formation region of the shallow trench isolation 302 is a white region, and all the active regions are marked with 301a, 301b, and 301c, respectively. The drain shallow trench isolation 302a is the shallow trench isolation 302 in a formation region of the drain structure, and the drain shallow trench isolation is marked with a mark 302a separately. Doped region structures formed in the active regions 201a, 201b, and 201c are not shown in FIG. 3A. The drain region 306a is formed in the active region 301b, and an active region where the channel region is located is a first active region 301c. The drain high voltage diffusion region 304a is mainly formed in the active region 301b and extends into the active region 301c. The gate conductive material layer 309 is referred to as a dashed line, and it can be seen that a first side face of the first active region 301c extends towards one side of the drain region 306a to the outside of the first side face of the gate conductive material layer 309. However, along the direction of the line A3A4, the gate conductive material layer 309 extends to the outside of the first active region 301c. An etching region of the first trench 311 is defined by using a mask of the gate conductive material layer 309. During etching of the first trench 311, a surface region of the semiconductor substrate 301 in the first active region 301c that is in a region covered by the gate conductive material layer 309 is etched, and the first trench 311 is not formed in the shallow trench isolation 302 outside the first active region 301c, that is, the etching region of the first trench 311 is an overlap region between the gate conductive material layer 309 and the first active region 301c.

An etching region of the second trench 312 is formed by extending the etching region of the first trench 311 to the surface of the drain shallow trench isolation 302a. As can be seen from FIG. 3A, the etching regions of the first trench 311 and the second trench 312 in FIG. 3C can be defined simultaneously by extending a region referred to as a dashed line box 312a on the basis of a pattern region of the gate conductive material layer 309. During an etching process, an overlap region between the dashed line box 312a and the drain shallow trench isolation 302a is not etched. An overlap region between the first active region 301c and an entire region formed by the gate conductive material layer 309 and the dashed line box 312a is etched to form the first trench 311 and the second trench 312 simultaneously.

In this embodiment of the present application, the second dielectric layer 313 and the gate dielectric layer 308 are formed simultaneously by means of the same process. The material of the gate dielectric layer 308 includes silicon oxide or a high dielectric constant material. The material of the second dielectric layer 313 also includes silicon oxide or a high dielectric constant material.

In some other embodiments, the second dielectric layer 313 and the gate dielectric layer 308 may also be formed by means of different processes. For example, when the gate dielectric layer 308 is of a high dielectric constant material, the second dielectric layer 313 may be of a material different from that of the gate dielectric layer 308, e.g., the second dielectric layer 313 is of silicon oxide.

In this embodiment of the present application, the HV device is of an asymmetrical structure, and the source region 306b is self-aligned with the second side face of the gate dielectric layer 308.

In other embodiments, alternatively, the HV device is of a symmetrical structure, a source shallow trench isolation 302 is formed in the source high voltage diffusion region 304b. The source shallow trench isolation is not shown in FIG. 3C. A first side face of the source shallow trench isolation 302 is aligned with the second side face of the gate dielectric layer 308, and the source region 306b is self-aligned with a second side face of the source shallow trench isolation 302. The source shallow trench isolation 302 and the drain shallow trench isolation 302a present a symmetrical structure.

In this embodiment of the present application, a peripheral high voltage diffusion region 306 doped with the second conductivity type of impurity is also formed in the first high voltage well region 303 on the periphery of the HV device, a substrate pickup region heavily doped with the second conductivity type of impurity is formed on the surface of the peripheral high voltage diffusion region 305, and the substrate pickup region is electrically connected to the source region 306b.

In this embodiment of the present application, the HV device is an N type device, the first conductivity type is an N type, and the second conductivity type is a P type. In other embodiments, the HV device may also be a P type device, the first conductivity type is a P type, and the second conductivity type is an N type.

The semiconductor substrate 301 is P type doped. In FIG. 3C, the semiconductor substrate 301 is also referred to as P-sub, and the first high voltage well region 303 is also referred to as HVPW, HVPW being the abbreviation of high voltage P type well. Both of the drain high voltage diffusion region 304a and the source high voltage diffusion region 304b are also referred to as HVNDF, the HVNDF being the abbreviation of high voltage N type diffusion. The peripheral high voltage diffusion region 305 is also referred to as HVPDF, HVPDF being the abbreviation of high voltage P type diffusion. The drain region 306a and the source region 306b are also referred to as SDN, SDN representing N type source and drain region. The substrate pickup region 307 is also referred to as SDP, SDP representing P type source and drain region. The shallow trench isolation 302 is also referred to as STI.

A metal interconnection layer is also formed on the semiconductor substrate, and the metal interconnection layer is not shown in FIG. 3C. The metal interconnection layer forms a plurality of front metal layer patterns and vias connecting the front metal layer patterns, ultimately forming a source, a drain, and a gate by patterning front metal layers.

The drain region 306a is connected to the drain, and the source region 306b and the substrate pickup region 307 are both connected to the source, that is, the source serves as a substrate bulk. The gate conductive material layer 309 is connected to the gate.

As can be seen from FIG. 3C, the gate conductive material layer 309 only extends to the surface of the second dielectric layer 313 without extending to the surface of the drain shallow trench isolation 302a. Similarly, as can be seen from FIG. 3B, the gate conductive material layer 309 only extends to the surface of the second dielectric layer 313 without extending to the surface of the drain shallow trench isolation 302a. A bottom corner of the second side face of the drain shallow trench isolation 302a is covered by the gate conductive material layer 309, and the bottom corner of the second side face of the drain shallow trench isolation 302a is a sharp corner. In this embodiment of the present application, when high voltages are applied to the gate and the drain simultaneously, no vertical negative electric field is present at the sharp corner of the drain shallow trench isolation 302a below the gate, preventing resultant hole trapping at the STI sharp corner, and thereby solving the problem of a surge current in the device under initial high voltage operation.

As can be seen from FIG. 3A, this embodiment of the present application can be implemented just by modifying the layout and is compatible with an existing process, and therefore there is no need for new process development.

In this embodiment of the present application, the second dielectric layer 313 is disposed between the drain shallow trench isolation 302a and the gate dielectric layer 308, the bottom surface of the second dielectric layer 313 is flush with the bottom surface of the gate dielectric layer 308, and the first side face of the gate conductive material layer 309 extends to the surface of the second dielectric layer 313, such that the gate conductive material layer 309 does not extend to the surface of the drain shallow trench isolation 302a. Since the bottom surface of the second dielectric layer 313 is flush with the bottom surface of the gate dielectric layer 308, the region covered by the gate conductive material layer 309 is a flat region, eliminating the sharp corner of the shallow trench isolation 302 below the gate conductive material layer and thereby eliminating the problem of a surge current in the device under initial high voltage operation which is caused by angled coverage of gate conductive material layer 309 on the shallow trench isolation 302.

Moreover, in this embodiment of the present application, the second trench 312 where the second dielectric layer 313 is located and the first trench 311 connect with each other to form an overall trench structure. In the prior art, the first trench 311 is directly defined by using the mask of the gate conductive material layer 309. In this embodiment of the present application, by extending the active region corresponding to the second side face of the drain shallow trench isolation 302a and extending the mask of the gate conductive material layer 309, both the first trench 311 and the second trench 312 can be obtained simultaneously via lithography definition and an etching process. Therefore, this embodiment of the present application can be achieved by improving a layout, and a process thereof is simple and easy to be implemented.

A method for manufacturing an HV device according to this embodiment of the present application includes the following steps:

Step 1. A semiconductor substrate 301 is provided, wherein a first high voltage well region 303 doped with a second conductivity type of impurity is formed on the semiconductor substrate 301, a drain high voltage diffusion region 304a doped with a first conductivity type of impurity and a source high voltage diffusion region 304b are formed in selected regions of the first high voltage well region 303, and a drain shallow trench isolation 302a is formed in a selected region of the drain high voltage diffusion region 304a.

In the method according to this embodiment of the present application, an active region is defined in the semiconductor substrate 301 by means of a shallow trench isolation 302, and the active region is composed of the semiconductor substrate 301 in a region enclosed by the shallow trench isolation 302. Referring to FIG. 3A, in addition to the drain shallow trench isolation 302a, a plurality of other shallow trench isolations 302 are provided at other positions. Referring to FIG. 3A, the shallow trench isolations 302 enclose a plurality of active regions in the semiconductor substrate 301, and active regions 301a, 301b, and 301c are shown in FIG. 3A.

The drain shallow trench isolation 302a is the shallow trench isolation 302 in a formation region of the drain structure, an active region where a channel region is located is a first active region 301c, and a first side face of the first active region 301c is defined by a second side face of the drain shallow trench isolation 302a.

The first side face of the first active region 301c extends towards one side of a drain region 306a to the outside of a first side face of the gate conductive material layer 309.

A peripheral high voltage diffusion region 305 doped with the second conductivity type of impurity is also formed in the first high voltage well region 303 on the periphery of the HV device.

Step 2. An etching region of a first trench 311 is defined, and the semiconductor substrate 301 in the etching region of the first trench 311 is etched to form the first trench 311.

An etching region of a second trench 312 is defined, and the semiconductor substrate 301 in the etching region of the second trench 312 is etched to form the second trench 312.

The second trench 312 is formed in the drain high voltage diffusion region 304a between a second side face of the drain shallow trench isolation 302a and a first side face of the first trench 311.

The second side face of the drain shallow trench isolation 302a is aligned with a first side face of the second trench 312. A second side face of the second trench 312 is aligned with the first side face of the first trench 311. The depth of the drain shallow trench isolation 302a is greater than the depth of the first trench 311.

The depth of the first trench 311 is equal to the depth of the second trench 312, and the first trench 311 and the second trench 312 connect with each other to form an overall trench.

In the method according to this embodiment of the present application, the first trench 311 and the second trench 312 are formed simultaneously by means of the same etching process.

Referring to FIG. 3A, the etching region of the first trench 311 is defined by using a mask of the gate conductive material layer 309. The etching region of the second trench 312 is formed by extending the etching region of the first trench 311 to the surface of the drain shallow trench isolation 302a. The etching regions of the first trench 311 and the second trench 312 are defined simultaneously in a formation region of the gate conductive material layer 309 and a region referred to as the dashed line box 312a. After etching, an overall trenched consisting of the first trench 311 and the second trench 312 is formed simultaneously in an overlap region between the formation region of the gate conductive material layer 309 and the first active region 301c and an overlap region between the region referred to as the dashed line box 312a and the first active region 301c Step 3. The first trench 311 is filled with a gate dielectric layer 308, and the second trench 312 is filled with a second dielectric layer 313.

A top surface of the gate dielectric layer 308 and a top surface of the second dielectric layer 313 are both flush with a top surface of the semiconductor substrate 301.

Bottom surfaces of the second dielectric layer 313 and the gate dielectric layer 308 are flush with each other.

A first side face of the gate dielectric layer 308 extends into the drain high voltage diffusion region 304a, and a second side face of the gate dielectric layer 308 extends into the source high voltage diffusion region 304b. The channel region is composed of the first high voltage well region 303 at the bottom of the gate dielectric layer 308.

In the method according to this embodiment of the present application, the second dielectric layer 313 and the gate dielectric layer 308 are formed simultaneously by means of the same process. The material of the gate dielectric layer 308 includes silicon oxide or a high dielectric constant material. The material of the second dielectric layer 313 includes silicon oxide or a high dielectric constant material.

In methods of other embodiments, the materials of the second dielectric layer 313 and the gate dielectric layer 308 may be different, for example, the material of the gate dielectric layer 308 is a high dielectric constant material and the material of the second dielectric layer 313 is silicon oxide.

Step 4. A gate conductive material layer 309 is formed, wherein the gate conductive material layer 309 is located on the surface of the gate dielectric layer 308 and extends to the surface of the second dielectric layer 313, and a region covered by the gate conductive material layer 309 has no sharp corner and is away from a bottom sharp corner of the drain shallow trench isolation 302a.

In the method according to this embodiment of the present application, the gate conductive material layer 309 includes a metal gate.

A sidewall spacer 310 is formed on a side face of the gate conductive material layer 309.

Step 5. Source and drain injection heavily doped with the first conductivity type of impurity is performed to form a source region 306b and a drain region 306a.

The drain region 306a is formed in a surface region of the drain high voltage diffusion region 304a outside a first side face of the drain shallow trench isolation 302a in a self-aligned manner, and a junction depth of the drain region 306a is less than the thickness of the second dielectric layer 313.

The source region 306b is formed in a surface region of the source high voltage diffusion region 304b.

A drain structure is located in the first high voltage well region 303 outside the first side face of the gate dielectric layer 308, and a source structure is located in the first high voltage well region 303 outside the second side face of the gate dielectric layer 308.

The drain structure includes the drain high voltage diffusion region 304a, the drain shallow trench isolation 302a, the second dielectric layer 313, and the drain region 306a.

The source structure includes the source high voltage diffusion region 304b and the source region 306b.

In the method according to this embodiment of the present application, the HV device is of an asymmetrical structure, and the source region 306b is self-aligned with the second side face of the gate dielectric layer 308 in step 5.

In methods of other embodiments, alternatively, the HV device is of a symmetrical structure. A source shallow trench isolation 302 is formed in the source high voltage diffusion region 304b in step 1. A first side face of the source shallow trench isolation 302 is aligned with the second side face of the gate dielectric layer 308 in step 3. The source region 306b is self-aligned with a second side face of the source shallow trench isolation 302 in step 5. The source shallow trench isolation 302 and the drain shallow trench isolation 302a present a symmetrical structure.

After step 5, the method further includes performing source and drain injection heavily doped with the second conductivity type of impurity to form a substrate pickup region on the surface of the peripheral high voltage diffusion region 305, and the substrate pickup region is electrically connected to the source region 306b.

The present application is described in detail above via specific embodiments, but these embodiments are not intended to limit the present application. Without departing from the principle of the present application, those skilled in the art can still make many variations and improvements, which should also be construed as falling into the protection scope of the present application.

What is claimed is:

1. An HV device, comprising:
   a gate dielectric layer, wherein the gate dielectric layer is formed in a first trench, wherein the first trench is formed by etching a semiconductor substrate, and wherein a top surface of the gate dielectric layer is configured to be flush with a top surface of the semiconductor substrate;
   a gate conductive material layer, formed on the top surface of the gate dielectric layer;
   a first high voltage well region, wherein the first high voltage well region is formed on the semiconductor substrate and is doped with a second conductivity type of impurity;
   a drain structure, wherein the drain structure is formed in the first high voltage well region outside a first side face of the gate dielectric layer;
   a source structure, wherein the source structure is formed in the first high voltage well region outside a second side face of the gate dielectric layer;
   wherein the drain structure comprises a drain high voltage diffusion region doped with a first conductivity type of impurity, a drain shallow trench isolation, a second dielectric layer, and a drain region heavily doped with the first conductivity type of impurity;
   wherein the drain high voltage diffusion region is formed in the first high voltage well region, and wherein the drain shallow trench isolation is formed in a selected region of the drain high voltage diffusion region;
   a second trench, wherein the second trench is formed in the drain high voltage diffusion region between a second side face of the drain shallow trench isolation and a first side face of the first trench, and wherein the second dielectric layer is formed in the second trench;
   wherein the second side face of the drain shallow trench isolation is aligned with a first side face of the second trench; wherein a second side face of the second trench is aligned with the first side face of the first trench; wherein a depth of the drain shallow trench isolation is greater than a depth of the first trench;

wherein the depth of the first trench is equal to a depth of the second trench, and wherein the first trench and the second trench connect with each other to form an overall trench; wherein a bottom surface of the second dielectric layer and a bottom surface of the gate dielectric layer are flush with each other; wherein a first side face of the gate conductive material layer extends to a surface of the second dielectric layer, such that a region covered by the gate conductive material layer has no sharp corner and is away from a bottom sharp corner of the drain shallow trench isolation;

wherein the drain region is formed in a surface region of the drain high voltage diffusion region outside a first side face of the drain shallow trench isolation, and wherein a junction depth of the drain region is less than a thickness of the second dielectric layer;

wherein the source structure comprises a source high voltage diffusion region and a source region heavily doped with the first conductivity type of impurity, wherein the source high voltage diffusion region is formed in the first high voltage well region, and wherein the source region is formed in a surface region of the source high voltage diffusion region; and wherein the first side face of the gate dielectric layer extends into the drain high voltage diffusion region, and wherein the second side face of the gate dielectric layer extends into the source high voltage diffusion region; and wherein a channel region includes the first high voltage well region at a bottom of the gate dielectric layer.

2. The HV device according to claim 1, wherein the first trench and the second trench are formed simultaneously by means of a same etching process.

3. The HV device according to claim 2, wherein an active region is defined in the semiconductor substrate by a shallow trench isolation, wherein the active region includes a portion of the semiconductor substrate enclosed by the shallow trench isolation;

wherein the shallow trench isolation includes the drain shallow trench isolation in a formation region of the drain structure; wherein the active region comprises a first active region located in the channel region, and wherein a first side face of the first active region is defined by the second side face of the drain shallow trench isolation;

wherein an etching region of the first trench is defined by using a mask of the gate conductive material layer; and wherein the first side face of the first active region extends towards one side of the drain region to the outside of the first side face of the gate conductive material layer, and wherein an etching region of the second trench is formed by extending the etching region of the first trench to a surface of the drain shallow trench isolation.

4. The HV device according to claim 3, wherein the second dielectric layer and the gate dielectric layer are formed simultaneously by a same process.

5. The HV device according to claim 4, wherein a material of the gate dielectric layer comprises silicon oxide or a high dielectric constant material.

6. The HV device according to claim 5, wherein the gate conductive material layer comprises a metal gate.

7. The HV device according to claim 1, wherein the HV device is of an asymmetrical structure, and wherein the source region is self-aligned with the second side face of the gate dielectric layer;

alternatively, the HV device is of a symmetrical structure, wherein a source shallow trench isolation is formed in the source high voltage diffusion region, wherein a first side face of the source shallow trench isolation is aligned with the second side face of the gate dielectric layer, wherein the source region is self-aligned with a second side face of the source shallow trench isolation; and wherein the source shallow trench isolation and the drain shallow trench isolation present a symmetrical structure.

8. The HV device according to claim 1, wherein a peripheral high voltage diffusion region doped with the second conductivity type of impurity is also formed in the first high voltage well region in the periphery of the HV device, wherein a substrate pickup region heavily doped with the second conductivity type of impurity is formed on a surface of the peripheral high voltage diffusion region, and wherein the substrate pickup region is electrically connected to the source region.

9. A method for manufacturing an HV device, comprising following steps:

step 1, providing a semiconductor substrate, wherein a first high voltage well region doped with a second conductivity type of impurity is formed on the semiconductor substrate, a drain high voltage diffusion region doped with a first conductivity type of impurity and a source high voltage diffusion region are formed in selected regions of the first high voltage well region, and wherein a drain shallow trench isolation is formed in a selected region of the drain high voltage diffusion region;

step 2, defining an etching region of a first trench, and etching the semiconductor substrate in the etching region of the first trench to form the first trench; and defining an etching region of a second trench, and etching the semiconductor substrate in the etching region of the second trench to form the second trench, wherein the second trench is formed in the drain high voltage diffusion region between a second side face of the drain shallow trench isolation and a first side face of the first trench;

wherein the second side face of the drain shallow trench isolation is aligned with a first side face of the second trench; wherein a second side face of the second trench is aligned with the first side face of the first trench; wherein a depth of the drain shallow trench isolation is greater than a depth of the first trench; and wherein the depth of the first trench is equal to a depth of the second trench, and the first trench and the second trench connect with each other to form an overall trench;

step 3, filling the first trench with a gate dielectric layer, and filling the second trench with a second dielectric layer, wherein a top surface of the gate dielectric layer and a top surface of the second dielectric layer are both flush with a top surface of the semiconductor substrate;

wherein a bottom surface of the second dielectric layer and a bottom surface of the gate dielectric layer are flush with each other;

wherein a first side face of the gate dielectric layer extends into the drain high voltage diffusion region, and wherein a second side face of the gate dielectric layer extends into the source high voltage diffusion region; and wherein a channel region includes the first high voltage well region at a bottom of the gate dielectric layer;

step 4, forming a gate conductive material layer, wherein the gate conductive material layer is located on the top surface of the gate dielectric layer and extends to a surface of the second dielectric layer, and wherein a region covered by the gate conductive material layer has no sharp corner and is away from a bottom sharp corner of the drain shallow trench isolation; and step 5, performing source and drain injection to form a source region and a drain region both heavily doped with the first conductivity type of impurity, wherein the drain region is formed in a surface region of the drain high voltage diffusion region outside a first side face of the drain shallow trench isolation in a self-aligned manner, and wherein a junction depth of the drain region is less than a thickness of the second dielectric layer;

wherein the source region is formed in a surface region of the source high voltage diffusion region;

wherein a drain structure is located in the first high voltage well region outside the first side face of the gate dielectric layer, and a source structure is located in the first high voltage well region outside the second side face of the gate dielectric layer;

wherein the drain structure comprises the drain high voltage diffusion region, the drain shallow trench isolation, the second dielectric layer, and the drain region; and wherein the source structure comprises the source high voltage diffusion region and the source region.

10. The method for manufacturing the HV device according to claim 9, wherein the first trench and the second trench are formed simultaneously by a same etching process in step 2.

11. The method for manufacturing the HV device according to claim 10, wherein an active region is defined by a shallow trench isolation in step 1 in the semiconductor substrate, and wherein the active region comprises a region enclosed by the shallow trench isolation in the semiconductor substrate; wherein the drain shallow trench isolation is located in a formation region of the drain structure, wherein the active region where the channel region is located is a first active region, and a first side face of the first active region is aligned with the second side face of the drain shallow trench isolation;

wherein the first side face of the first active region extends towards one side of the drain region to an outside of a first side face of the gate conductive material layer;

wherein the etching region of the first trench is defined by using a mask of the gate conductive material layer in step 2; and wherein the etching region of the second trench is formed by extending the etching region of the first trench to a surface of the drain shallow trench isolation.

12. The method for manufacturing the HV device according to claim 10, wherein the second dielectric layer and the gate dielectric layer are formed simultaneously by a same process in step 3.

13. The method for manufacturing the HV device according to claim 10, wherein a material of the gate dielectric layer in step 3 comprises silicon oxide or a high dielectric constant material.

14. The method for manufacturing the HV device according to claim 13, wherein the gate conductive material layer in step 4 comprises a metal gate.

15. The method for manufacturing the HV device according to claim 9, wherein the HV device is of an asymmetrical structure, and the source region is self-aligned with the second side face of the gate dielectric layer in step 5;

alternatively, the HV device is of a symmetrical structure, wherein a source shallow trench isolation is formed in the source high voltage diffusion region in step 1, a first side face of the source shallow trench isolation is aligned with the second side face of the gate dielectric layer in step 3, and wherein the source region is self-aligned with a second side face of the source shallow trench isolation in step 5; and the source shallow trench isolation and the drain shallow trench isolation present a symmetrical structure.

16. The method for manufacturing the HV device according to claim 9, wherein a peripheral high voltage diffusion region doped with the second conductivity type of impurity is formed in the first high voltage well region on a periphery of the HV device in step 1;

after step 5, the method further comprises performing source and drain injection to form a substrate pickup region which is heavily doped with the second conductivity type of impurity, on a surface of the peripheral high voltage diffusion region, and wherein the substrate pickup region is electrically connected to the source region.

* * * * *